United States Patent
Chang et al.

(10) Patent No.: US 12,334,168 B2
(45) Date of Patent: Jun. 17, 2025

(54) FLASH MEMORY MODULE TESTING METHOD AND ASSOCIATED MEMORY CONTROLLER AND MEMORY DEVICE

(71) Applicant: Silicon Motion, Inc., Hsinchu County (TW)

(72) Inventors: Chiu-Han Chang, Taipei (TW); Yu-Ting Chen, New Taipei (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 18/236,409

(22) Filed: Aug. 22, 2023

(65) Prior Publication Data

US 2024/0194282 A1 Jun. 13, 2024

(30) Foreign Application Priority Data

Dec. 13, 2022 (TW) ................................. 111147753

(51) Int. Cl.
*G11C 29/10* (2006.01)
(52) U.S. Cl.
CPC ................................. *G11C 29/10* (2013.01)
(58) Field of Classification Search
CPC ........... G11C 29/10; G11C 29/50; G11C 7/04; G11C 29/06; G11C 29/56; G11C 29/42
See application file for complete search history.

(56) References Cited

U.S. PATENT DOCUMENTS

| | | | |
|---|---|---|---|
| 6,667,928 B2* | 12/2003 | Honma | G11C 29/02 327/536 |
| 6,684,353 B1 | 1/2004 | Parker | |
| 7,873,885 B1 | 1/2011 | Shin | |
| 8,694,861 B2 | 4/2014 | Ito | |
| 10,553,301 B2 | 2/2020 | K | |
| 2004/0218440 A1* | 11/2004 | Kumar | G11C 29/16 365/202 |
| 2009/0282305 A1* | 11/2009 | Chen | G11C 29/42 714/E11.159 |
| 2017/0212805 A1* | 7/2017 | Zhu | H03M 13/3761 |
| 2019/0196896 A1* | 6/2019 | Wu | G11C 29/50016 |
| 2019/0205244 A1* | 7/2019 | Smith | G06F 3/065 |
| 2020/0081851 A1* | 3/2020 | Mittal | G06F 13/1678 |
| 2020/0082901 A1* | 3/2020 | Mittal | G06F 11/1048 |
| 2021/0233601 A1* | 7/2021 | Mittal | G11C 29/44 |
| 2021/0286665 A1* | 9/2021 | Mittal | G06F 13/161 |

* cited by examiner

*Primary Examiner* — Albert Decady
*Assistant Examiner* — Osman M Alshack
(74) *Attorney, Agent, or Firm* — Winston Hsu

(57) ABSTRACT

A method for performing a test upon a flash memory module includes: performing data writing upon a plurality of first blocks of a first group in the flash memory module; reading the plurality of first blocks of the first group to determine whether there is any abnormal block in the plurality of first blocks and generating a first test result; after the plurality of first blocks are read, performing data writing upon a plurality of second blocks of a second group in the flash memory module; and reading the plurality of second blocks of the second group to determine whether there is any abnormal block in the plurality of second blocks and generating a second test result.

11 Claims, 5 Drawing Sheets

FLASH MEMORY MODULE TESTING METHOD AND ASSOCIATED MEMORY CONTROLLER AND MEMORY DEVICE

BACKGROUND OF THE INVENTION

1. Field of the Invention

The present invention is related to a flash memory, and more particularly, to a test flow of the flash memory and associated flash memory controller and memory device.

2. Description of the Prior Art

After a flash memory module and a flash memory controller are assembled into a memory device, the memory device will be tested in the factory to check whether the function of each block in the flash memory module is normal. If an abnormal block is detected, the flash memory controller will be configured to avoid using the abnormal block. In the testing process, the flash memory controller will write data into each block of the flash memory module, and then read each block to determine whether there is a read exception, wherein if there is a read exception, it is determined that an abnormal block is read. Since the temperature of the flash memory module will increase during data writing, the temperature of a block where data writing is performed may be greatly different from the temperature of a block where data reading is performed. This may cause the read exception to occur when data reading is performed upon a block with acceptable quality, therefore causing the block to be misjudged as an abnormal block.

SUMMARY OF THE INVENTION

It is therefore one of the objectives of the present invention to provide a testing method for a flash memory module that groups blocks for testing to thereby avoid an excessive temperature difference between blocks where data writing is performed and blocks where data reading is performed.

According to an embodiment of the present invention, a method for testing a flash memory module is provided. The method comprises: performing data writing upon a plurality of first blocks of a first group in the flash memory module; reading the plurality of first blocks of the first group to determine whether there is any abnormal block in the plurality of first blocks and generating a first test result; after the plurality of first blocks are read, performing data writing upon a plurality of second blocks of a second group in the flash memory module; and reading the plurality of second blocks of the second group to determine whether there is any abnormal block in the plurality of second blocks and generating a second test result.

According to an embodiment of the present invention, a flash memory controller is provided, wherein the flash memory controller is arranged to access a flash memory module, the flash memory controller comprises a read only memory and a microprocessor, the read only memory is arranged to store a program code, and the microprocessor is arranged to execute the program code to control access of the flash memory module. The microprocessor is further arranged to: perform data writing upon a plurality of first blocks of a first group in the flash memory module; read the plurality of first blocks of the first group to determine whether there is any abnormal block in the plurality of first blocks and generate a first test result; after the plurality of first blocks are read, perform data writing upon a plurality of second blocks of a second group in the flash memory module; and read the plurality of second blocks of the second group to determine whether there is any abnormal block in the plurality of second blocks and generate a second test result.

According to an embodiment of the present invention, a memory device is provided, wherein the memory device comprises a flash memory module and a flash memory controller, and the flash memory controller is arranged to access the flash memory module. The flash memory controller is further arranged to: perform data writing upon a plurality of first blocks of a first group in the flash memory module; read the plurality of first blocks of the first group to determine whether there is any abnormal block in the plurality of first blocks and generate a first test result; after the plurality of first blocks are read, perform data writing upon a plurality of second blocks of a second group in the flash memory module; and read the plurality of second blocks of the second group to determine whether there is any abnormal block in the plurality of second blocks and generate a second test result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
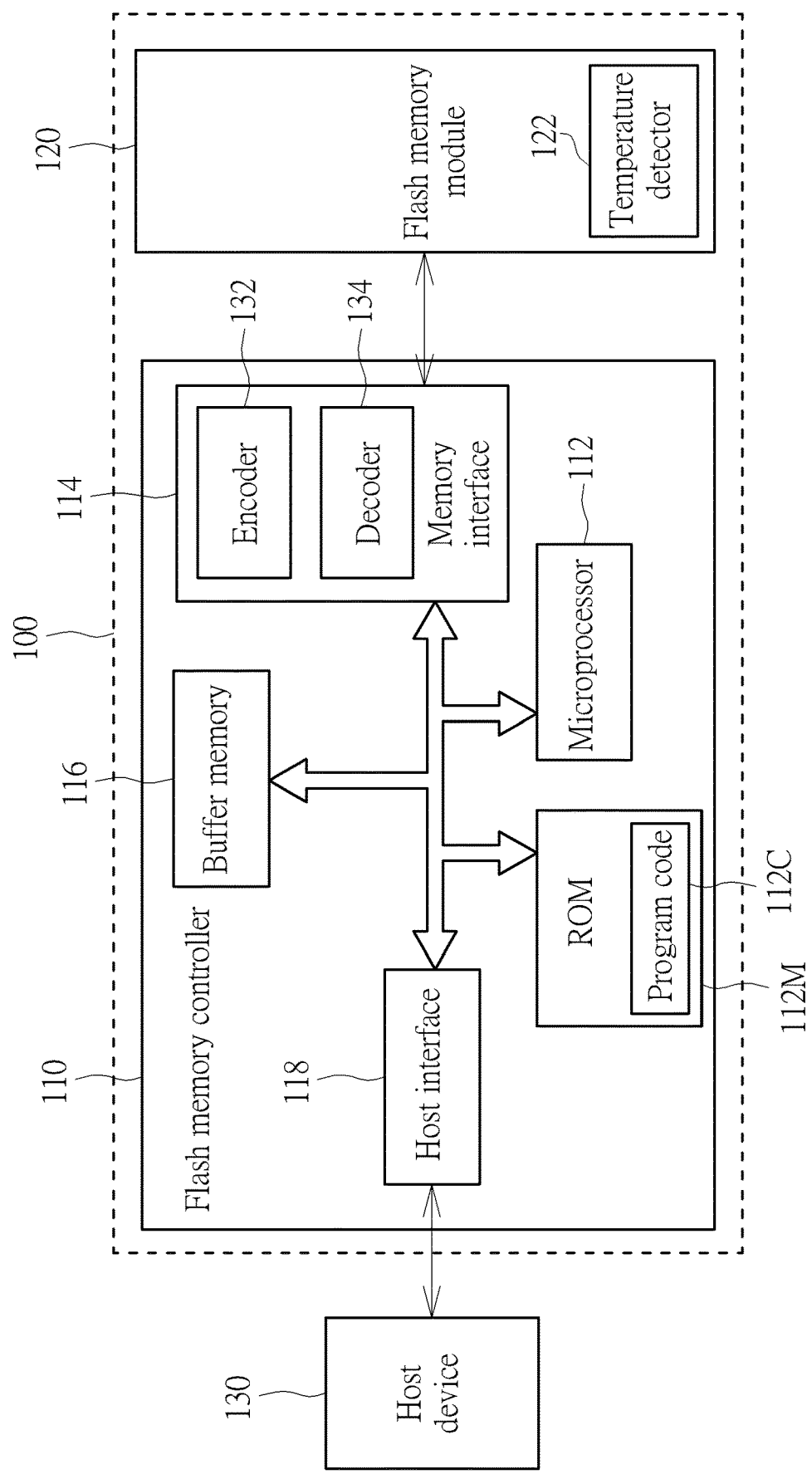
FIG. 1 is a diagram illustrating a memory device according to an embodiment of the present invention.

FIG. 1 is a diagram illustrating a memory device 100 according to an embodiment of the present invention. The memory device 100 includes a flash memory controller 110 and a flash memory module 120, wherein the flash memory controller 110 is arranged to access the flash memory module 120. The flash memory controller 110 includes a microprocessor 112, a read only memory (ROM) 112M, a memory interface 114, a buffer memory 116, and a host interface 118. The ROM 112M is arranged to store program code 112C, and the microprocessor 112 is arranged to execute the program code 112C to control access of the flash memory module 120. The memory interface 114 includes an encoder 132 and a decoder 134, wherein the encoder 132 is arranged to encode data that is written into the flash memory module 120 to generate a corresponding parity (also known as an error correction code (ECC)), and the decoder 134 is arranged to decode data that is read from the flash memory module 120.

The flash memory module 120 includes a plurality of flash memory chips, and each flash memory chip includes a plurality of blocks. A controller (e.g. the flash memory controller 110 that executes the program code 112C through the microprocessor 112) may copy, erase, and merge data for the flash memory module 120 with a block as a unit. In addition, a block can record a specific number of pages, wherein the controller (e.g. the flash memory controller 110 that executes the program code 112C through the microprocessor 112) may perform data writing upon the flash memory module 120 with a page as a unit. In other words, a block is the smallest erase unit in the flash memory module 120, and a page is the smallest write unit in the flash memory module 120. In this embodiment, the flash memory module 120 further includes a temperature detector 122, wherein the temperature detector 122 is arranged to detect a current temperature of the flash memory module 120, and transmit the detected temperature to the flash memory controller 110.

In practice, the flash memory controller 110 that executes the program code 112C through the microprocessor 112 may utilize its own internal components to perform many control operations. For example, the flash memory controller 122 may utilize the memory interface 114 to control access of the flash memory module 120 (more particularly, access at least one block or at least one page), utilize the buffer memory 116 to perform a required buffering operation, and utilize the host interface 118 to communicate with a host device 130.

In one embodiment, the memory device 100 may be a portable memory device such as a memory card which conforms to one of the SD/MMC, CF, MS and XD specifications, and the host device 130 is an electronic device able to be connected to the memory device 100, such as a cellphone, a laptop, a desktop computer, etc. In another embodiment, the memory device 100 can be a solid state drive (SSD) or an embedded storage device conforming to the universal flash storage (UFS) or embedded multi-media card (EMMC) specifications, and can be arranged in an electronic device. For example, the memory device 100 can be arranged in a cellphone, a laptop, or a desktop computer. In this case, the host device 130 can be a processor of the electronic device.

After the memory device 100 is assembled, the memory device 100 needs to be tested to determine whether each block in the flash memory module 120 is normal for subsequent processing. For example, the level of the memory device 100 is classified according to a number of abnormal blocks of the flash memory module 120. In another example, address information of abnormal blocks of the flash memory module 120 is recorded in a damaged block record table so that the memory device 110 can avoid these abnormal blocks when data reading/writing is performed.

Figure 2:
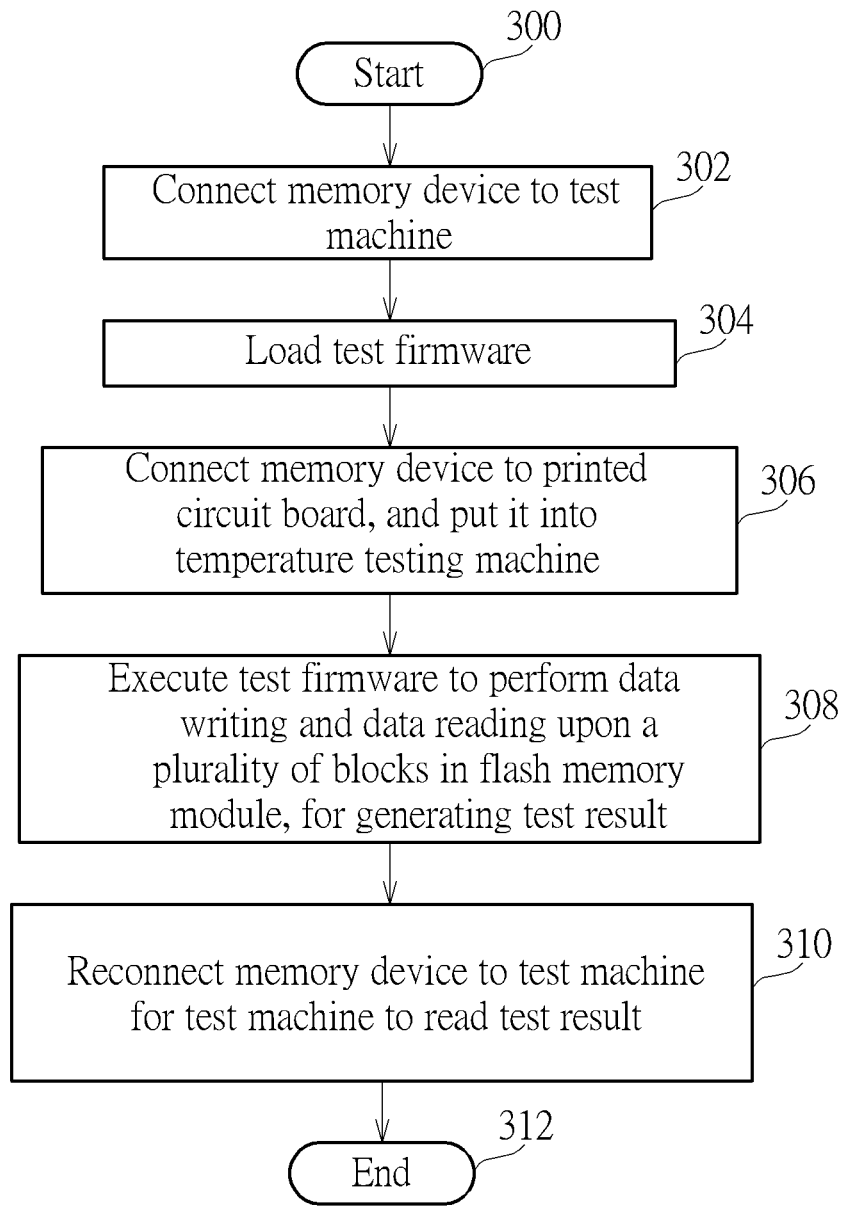
FIG. 2 is a flow chart of performing a test upon a memory device according to an embodiment of the present invention.

FIG. 2 is a flow chart of performing a test upon the memory device 100 according to an embodiment of the present invention.

In Step 300, the flow starts, and the memory device 100 is assembled.

In Step 302, an engineer connects the memory device 100 to a test machine through a test carrier.

In Step 304, the test machine confirms the model of the memory device 100 and checks its status and functions through the operating software therein, and then loads a test firmware into the memory device 100, wherein the test firmware can be a self-burn-in firmware.

In Step 306, the engineer takes out the memory device 100 from the test carrier, connects the memory device 100 to a printed circuit board, and puts it into a temperature testing machine, wherein the function of the printed circuit board is to provide a supply voltage to the memory device 100, and the temperature testing machine can be regarded as an oven that is arranged to provide a fixed ambient temperature for the memory device 100.

In Step 308, the memory device 100 automatically starts to execute the test firmware to perform data writing and data reading upon a plurality of blocks in the flash memory module 120, for determining whether each block is normal and generating a test result accordingly, wherein the test result is stored in the flash memory module 120.

In Step 310, the engineer takes out the memory device 100 from the temperature testing machine, and reconnects the memory device 100 to the test machine for reading the test result from the flash memory module 120 by the test machine.

In Step 312, the flow ends.

In Step 308 of FIG. 2, the temperature will continue to increase when data writing is performed upon the flash memory module 120 through the flash memory controller 110. In order to avoid a great difference between the temperature of the block where data writing is performed and the temperature of the block where data reading is performed, which may cause a read exception to occur when data reading is performed upon a block with acceptable quality, thereby causing the block to be misjudged as an abnormal block, the present invention provides a method for grouping blocks for testing.

Figure 3:
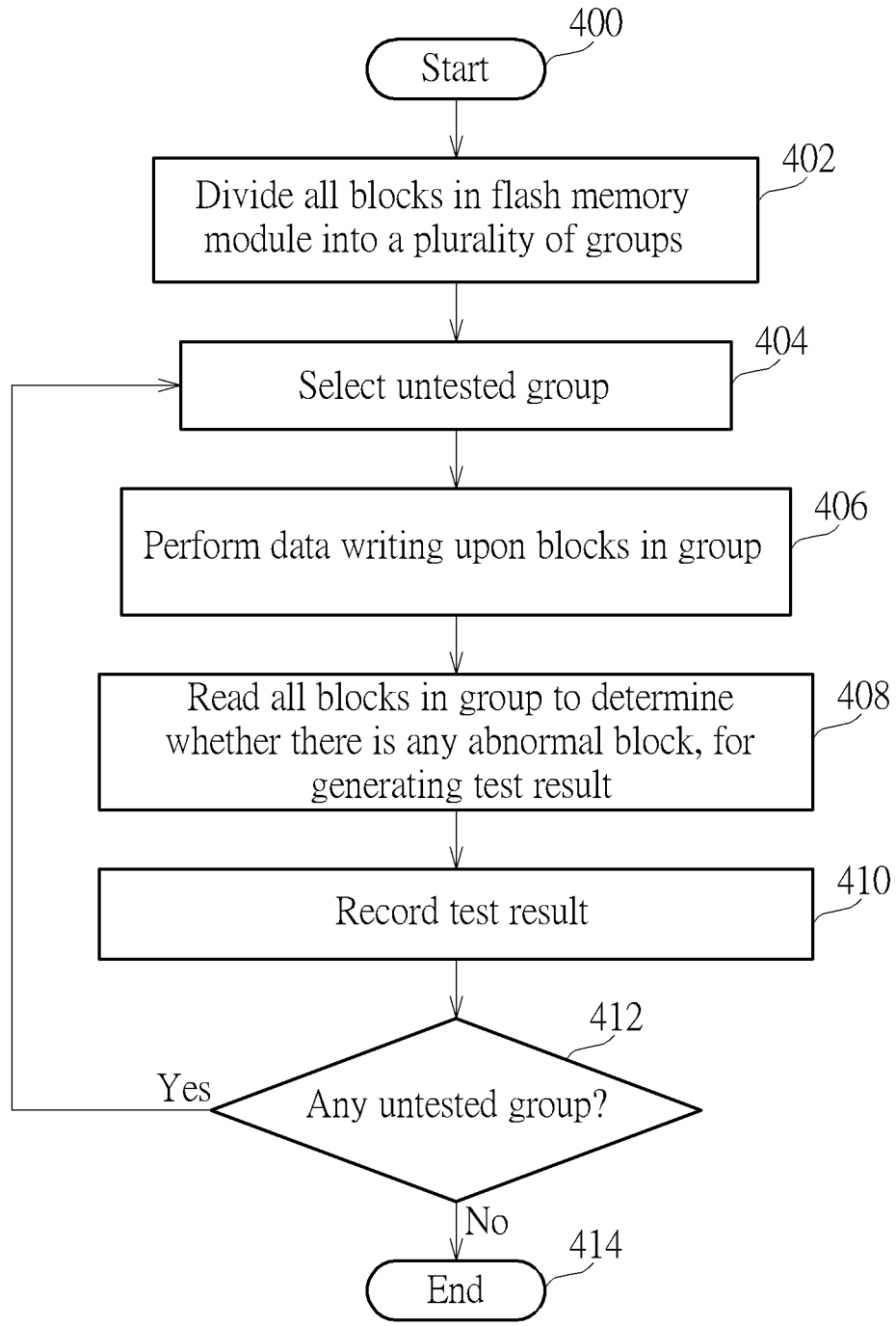
FIG. 3 is a flow chart of performing a test upon each block in a flash memory module through executing a test firmware by a flash memory controller according to an embodiment of the present invention.

FIG. 3 is a flow chart of performing a test upon each block in the flash memory module 120 through executing the test firmware by the flash memory controller 110 according to an embodiment of the present invention, wherein the flow of FIG. 3 describes Step 308 of FIG. 2.

In Step 400, the flow starts, and the microprocessor 112 in the flash memory controller 110 executes the test firmware.

Figure 4:
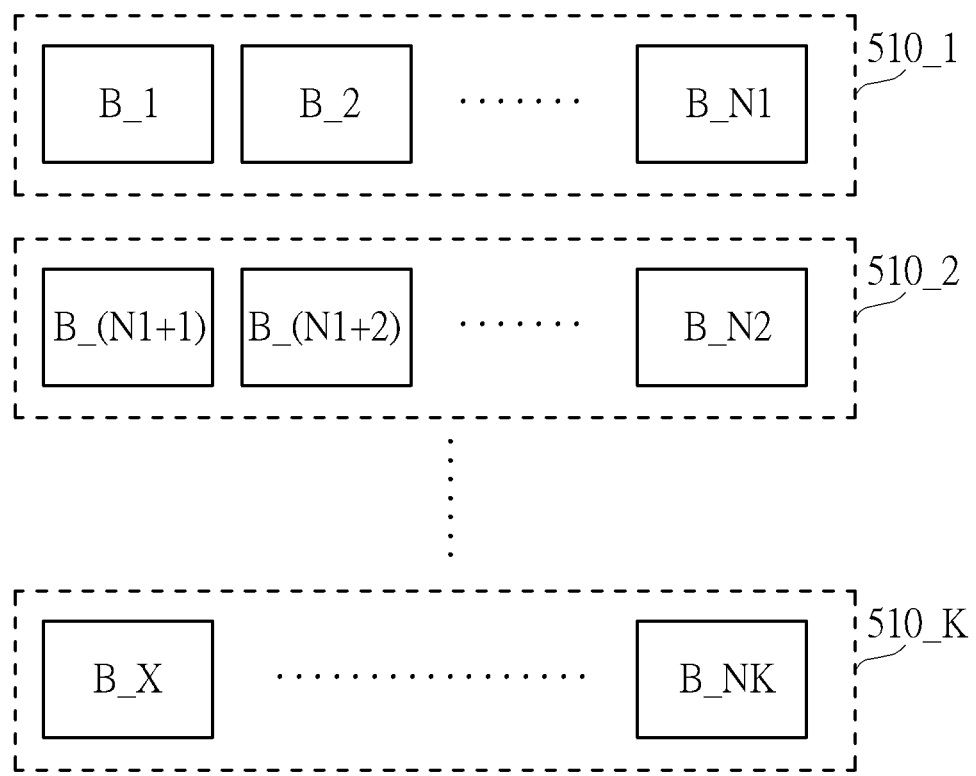
FIG. 4 is a diagram illustrating dividing blocks in a flash memory module into a plurality of groups.

In Step 402, the microprocessor 112 in the flash memory controller 110 divides all blocks in the flash memory module 120 into a plurality of groups, wherein each group includes a plurality of blocks. FIG. 4 is an illustration of this process. Assume that the flash memory module 120 includes a plurality of blocks B_1-B_NK. The flash memory controller 110 may establish a plurality of groups 510_1-510_K, wherein the group 510_1 includes the blocks B_1-B_N1, the group 510_2 includes the blocks B_(N1+1)-B_N2, and the group 510_K includes the blocks B_X-B_NK. In an embodiment, a number of blocks included in each group can be the same. An engineer can determine the number of blocks included in each group according to a number of all blocks of the flash memory module 120, an estimated temperature increase rate when data writing is performed upon the block, the robustness of the block, or other associated parameters. In another embodiment, since the temperature increase rate of the memory device 100 is unfixed during the test, the engineer can estimate a temperature change curve of the memory device 100 during the test to determine the most suitable number of blocks for each group, so that the temperature change of each group during the test will be within a critical value. Assume that the temperature of the memory device 100 increases rapidly at the beginning of the test, and the temperature increase rate will then become more and more gradual. Under this situation, the group 510_1 that is tested earlier will have a smaller number of blocks, and the group 510_K that is tested later will have a larger number of blocks.

In Step 404, the microprocessor 112 selects an untested group, such as the group 510_1.

In Step 406, the microprocessor 112 sequentially performs data writing upon the blocks B_1-B_N1 in the group 510_1, to write data into the blocks B_1-B_N1, wherein the data can be any data with a suitable pattern. In detail, the microprocessor 112 may perform an erase operation upon the block B_1, encode the data through the encoder 132, and write the encoded data into at least one data page of the block B_1; perform an erase operation upon the block B_2, encode the data through the encoder 132, and write the encoded data into at least one data page of the block B_2; and so on, until the microprocessor 112 encodes the data through the encoder 132 and writes the encoded data into at least one data page of the block B_N1. In another embodiment, the microprocessor 112 may perform an erase operation upon the blocks B_1-B_N1 first, and then sequentially write the data into the blocks B_1-B_N1.

In Step 408, after data writing has been performed upon the blocks B_1-B_N1 of the group 510_1, the microprocessor 112 may read the data in the blocks B_1-B_N1 to determine whether there is any abnormal block in the blocks B_1-B_N1 for generating a test result. Specifically, the microprocessor 112 may read the previously written data from the block B_1, and decode the read data through the decoder 134 (e.g. decode the read data by a Bose-Chaudhuri-Hocquenghem (BCH) code decoding method or a low-density parity-check (LDPC) code decoding method). In this embodiment, if the decoder 134 cannot successfully decode the read data (e.g. there are too many error bits in the data), the microprocessor 112 may determine that the block is an abnormal block. If the decoder 134 can successfully decode the read data, the microprocessor 112 may determine that the block is a normal block.

In an embodiment, a sequence for the microprocessor 112 to perform data reading upon the blocks in the group 510_1 is identical to a sequence for the microprocessor 112 to perform data writing upon the blocks in the group 510_1. Refer to FIG. 4 again. Assume that the microprocessor 112 sequentially writes data into the blocks B_1, B_2, . . . , B_N1 of the group 510_1. Similarly, the microprocessor 112 will sequentially read data from the blocks B_1, B_2, . . . , B_N1, but the present invention is not limited thereto.

In Step 410, the microprocessor 112 writes a test result of the group 510_1 into a specific block of the flash memory module 120, wherein the specific block may be a first block (e.g. the block B_1) or any other suitable block (e.g. a normal block).

In Step 412, the microprocessor 112 determines whether there is any untested group in the flash memory module 120. If Yes, Step 412 is entered to select a next untested group (e.g. the group 510_2); if No, Step 414 is enters to end the flow.

In the embodiments of FIG. 3 and FIG. 4, by grouping the blocks of the flash memory module 120 for testing, a difference between the temperature of each block when data writing is performed and the temperature of each block when data reading is performed will not be too large, so that the problem of the original block of acceptable quality being misjudged as an abnormal block can be avoided.

Figure 5:
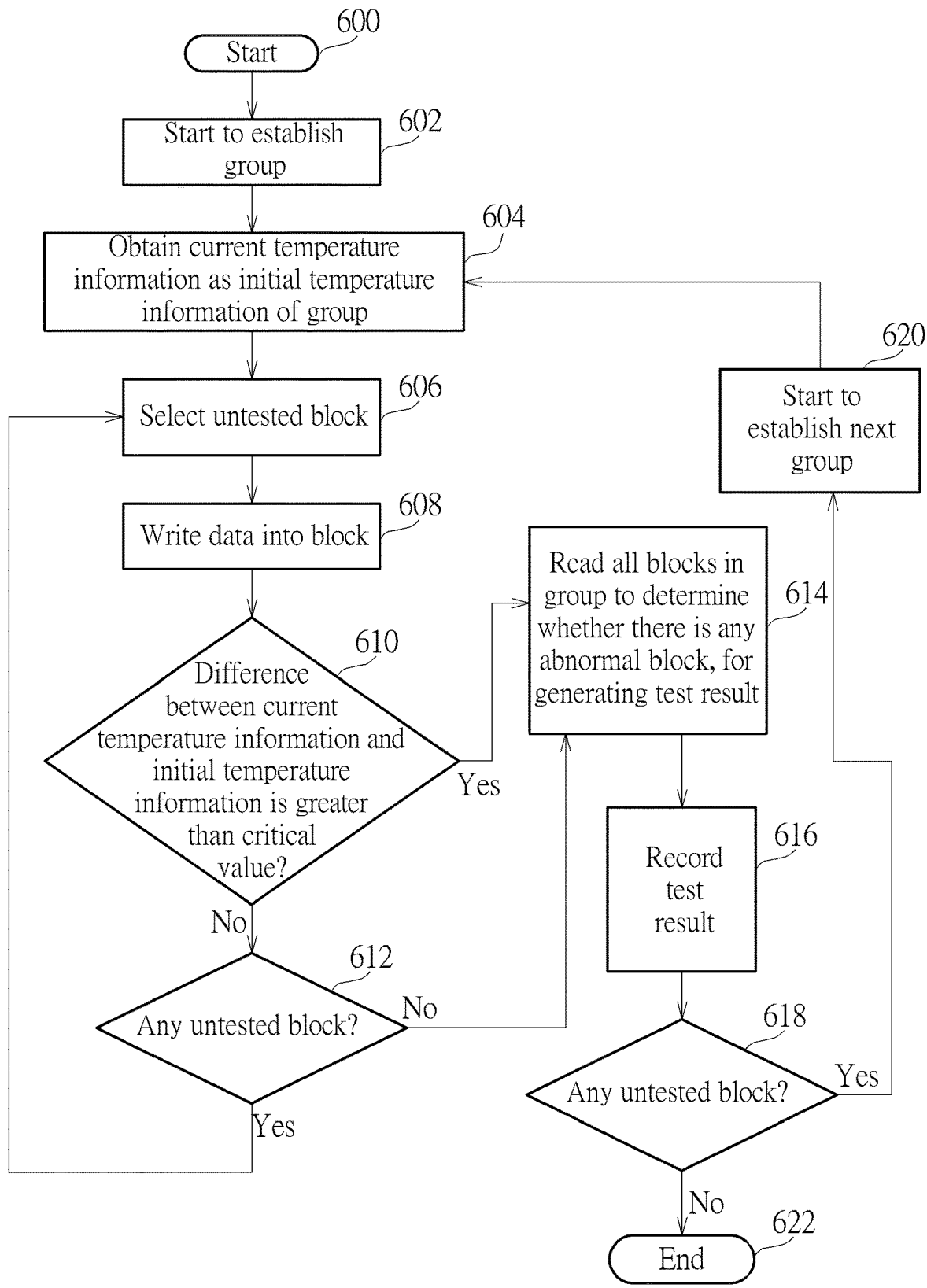
FIG. 5 is a flow chart of performing a test upon each block in a flash memory module through executing a test firmware by a flash memory controller according to another embodiment of the present invention.

FIG. 5 is a flow chart of performing a test upon each block in the flash memory module 120 through executing the test firmware by the flash memory controller 110 according to another embodiment of the present invention.

In Step 600, the flow starts, and the microprocessor 112 in the flash memory controller 110 executes the test firmware.

In Step 602, the microprocessor 112 starts to establish a group. Refer to FIG. 4 again for an illustration. The currently established group is the group 510_1, and the number of blocks included in the group 510_1 has not been determined.

In Step 604, the microprocessor 112 obtains current temperature information from the temperature detector 122 in the flash memory module 120 to act as initial temperature information of the group 510_1. In an embodiment, the microprocessor 112 may actively send a request command to the flash memory module 120 to request the temperature detector 122 to provide a currently detected temperature to the microprocessor 112. In another embodiment, the temperature detector 122 may actively provide the currently detected temperature to the microprocessor 112 (e.g. periodically provide the detected temperature to the microprocessor 112).

In Step 606, the microprocessor 112 selects an untested block from the flash memory module 120, wherein the selected block belongs to the group 510_1.

In Step 608, the microprocessor 112 performs data writing upon the selected block to write data into the selected block, wherein the data may be any data with a suitable pattern. Take the block B_1 as an example. The microprocessor 112 may perform an erase operation upon the block B_1, encode the data by the encoder 132, and write the encoded data into at least one data page of the block B_1.

In Step 610, the microprocessor 112 obtains current temperature information from the temperature detector 122 in the flash memory module 120 again, and determines whether a difference between the current temperature information and the initial temperature information obtained in Step 604 is greater than a critical value or is located within a specific range. If Yes, Step 614 is entered; if No, Step 612 is entered.

In Step 612, since the difference between the current temperature information and the initial temperature information obtained in Step 604 is smaller than the critical value or is not located within the specific range, it can be determined that the current temperature of the blocks in the group 510_1 will not be too high when data writing is performed. As a result, the microprocessor 112 determines whether there is currently any untested block in the flash memory module 120. If Yes, Step 606 is entered to select the untested block to keep performing data writing; if No, Step 614 is entered.

In Step 614, since the difference between the current temperature information and the initial temperature information obtained in Step 604 is greater than the critical value or is located within the specific range, or the flash memory module 120 does not have any untested block currently, the microprocessor 112 stops establishing the group 510_1, starts to sequentially read the content of all blocks in the group 510_1 for determining whether there is any abnormal block, and accordingly generates a test result. Specifically, the microprocessor 112 may read the previously written data from the block B_1, and decode the read data through the decoder 134 (e.g. decode the read data by the BCH code decoding method or the LDPC code decoding method). In this embodiment, if the decoder 134 cannot successfully decode the read data (e.g. there are too many error bits in the data), the microprocessor 112 may determine that the block is an abnormal block. If the decoder 134 can successfully decode the read data, the microprocessor 112 may determine that the block is a normal block.

In an embodiment, a sequence for the microprocessor 112 to perform data reading upon the blocks in the group 510_1 is identical to a sequence for the microprocessor 112 to perform data writing upon the blocks in the group 510_1. Refer to FIG. 4 again. Assume that the microprocessor 112 sequentially writes data into the blocks B_1, B_2, . . . , B_N1 of the group 510_1. Similarly, the microprocessor 112 will sequentially read data from the blocks B_1, B_2, . . . , B_N1, but the present invention is not limited thereto.

In Step 616, the microprocessor 112 writes the test result of the group 510_1 into a specific block of the flash memory module 120, wherein the specific block may be a first block (e.g. the block B_1) or any other suitable block (e.g. a normal block).

In Step 618, the microprocessor 612 determines whether there is currently any untested block in the flash memory module 120. If Yes, Step 620 is entered; if No, Step 622 is entered to end the flow.

In Step 620, the microprocessor 612 starts to establish a next group (e.g. the group 510_2), and Step 604 is entered again to perform associated data writing and data reading upon the blocks according to the temperature information.

It should be noted that the time points of obtaining the current temperature information in Step 604 and Step 610 can be slightly adjusted according to the engineer's design, and are not limited to the sequence of the steps shown in FIG. 5. For example, the initial temperature information of the group 510_1 can be obtained by the temperature detector 122 before, during, or after data writing is performed upon the block B_1. That is, a time point of the generation of the initial temperature information is close to the time of data writing performed upon the block B_1.

In the embodiment of FIG. 5, by grouping the blocks of the flash memory module 120 for testing, a difference between the temperature of each block when data writing is performed and the temperature of each block when data reading is performed will not be too large, so that the problem of the original block with acceptable quality being misjudged as an abnormal block can be avoided. In addition, since the number of blocks included in each group is dynamically determined according to the temperature information provided by the temperature detector 122, the method of the present invention not only makes each group have the most suitable number of blocks, but also minimizes the number of groups, which prevents the microprocessor 112 from switching between the write command and the read command multiple times and therefore improves the efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing a test upon a flash memory module, comprising:
sequentially performing data writing upon a plurality of first blocks of a first group in the flash memory module;
after the plurality of first blocks of a first group are written, starting to read the plurality of first blocks of the first group to determine whether there is any abnormal block in the plurality of first blocks and generating a first test result;
after the plurality of first blocks are read, sequentially performing data writing upon a plurality of second blocks of a second group in the flash memory module, wherein the plurality of second blocks are different from the plurality of first blocks; and
after the plurality of second blocks of a first group are written, starting to read the plurality of second blocks of the second group to determine whether there is any abnormal block in the plurality of second blocks and generating a second test result;
wherein each of the plurality of first blocks and the plurality of second blocks is a smallest erase unit in the flash memory module;
wherein the method further comprises:
determining a number of first blocks of the first group according to a plurality of temperature information of the flash memory module;
wherein the step of determining the number of first blocks of the first group according to the plurality of temperature information of the flash memory module comprises:
determining the number of first blocks of the first group according to an initial temperature information of a first of the plurality of first blocks of the first group where data writing is performed and a temperature information of subsequent blocks in the flash memory module where data writing is performed;
wherein the step of determining the number of first blocks of the first group according to the plurality of temperature information of the flash memory module comprises:
recording the initial temperature information before data writing is performed upon the first of the plurality of first blocks of the first group or the initial temperature information when data writing is performed upon the first of the plurality of first blocks of the first group;
sequentially performing data writing upon the subsequent blocks in the flash memory module, and keeping detecting a current temperature information of the flash memory module; and
in response to a difference between the current temperature information and the initial temperature information being greater than a critical value or being within a specific range, stopping performing data writing upon the subsequent blocks of the flash memory module, and regarding blocks that are located after the first of the plurality of first blocks of the first group and have completed data writing as the plurality of first blocks of the first group.

2. The method of claim 1, further comprising:
dividing all blocks in the flash memory module into a plurality of groups, wherein the plurality of groups comprise the first group and the second group.

3. The method of claim 2, wherein each of the plurality of groups has a same number of blocks.

4. The method of claim 2, wherein the step of dividing all blocks in the flash memory module into the plurality of groups comprises:
estimating a temperature change curve of the flash memory module during the test to determine a number of blocks comprised in each of the plurality of groups, so that a temperature change of each of the plurality of groups during the test is within a critical value.

5. The method of claim 1, wherein the step of determining the number of first blocks of the first group according to the plurality of temperature information of the flash memory module further comprises:
in response to there not being any untested block in the flash memory module, stopping performing data writing upon the subsequent blocks of the flash memory module, and regarding the blocks that are located after the first of the plurality of first blocks of the first group and have completed data writing as the plurality of first blocks of the first group.

6. The method of claim 1, wherein the method is performed by executing a self-burn-in firmware.

7. A flash memory controller, wherein the flash memory controller is arranged to access a flash memory module, and the flash memory controller comprises:
- a read only memory, arranged to store a program code;
- a microprocessor, arranged to execute the program code to control access of the flash memory module;
- wherein the microprocessor is further arranged to:
  - sequentially perform data writing upon a plurality of first blocks of a first group in the flash memory module;
  - after the plurality of first blocks of a first group are written, start to read the plurality of first blocks of the first group to determine whether there is any abnormal block in the plurality of first blocks and generate a first test result;
  - after the plurality of first blocks are read, sequentially perform data writing upon a plurality of second blocks of a second group in the flash memory module, wherein the plurality of second blocks are different from the plurality of first blocks; and
  - after the plurality of second blocks of a first group are written, start to read the plurality of second blocks of the second group to determine whether there is any abnormal block in the plurality of second blocks and generate a second test result;
- wherein each of the plurality of first blocks and the plurality of second blocks is a smallest erase unit in the flash memory module;
- wherein the microprocessor is further arranged to:
  - determine a number of first blocks of the first group according to a plurality of temperature information of the flash memory module;
- wherein the step of determining the number of first blocks of the first group according to the plurality of temperature information of the flash memory module comprises:
  - determining the number of first blocks of the first group according to an initial temperature information of a first of the plurality of first blocks of the first group where data writing is performed and a temperature information of subsequent blocks in the flash memory module where data writing is performed;
- wherein the step of determining the number of first blocks of the first group according to the plurality of temperature information of the flash memory module comprises:
  - recording the initial temperature information before data writing is performed upon the first of the plurality of first blocks of the first group or the initial temperature information when data writing is performed upon the first of the plurality of first blocks of the first group;
  - sequentially performing data writing upon the subsequent blocks in the flash memory module, and keeping detecting a current temperature information of the flash memory module; and
  - in response to a difference between the current temperature information and the initial temperature information being greater than a critical value or being within a specific range, stopping performing data writing upon the subsequent blocks of the flash memory module, and regarding blocks that are located after the first of the plurality of first blocks of the first group and have completed data writing as the plurality of first blocks of the first group.

8. The flash memory controller of claim 7, wherein the microprocessor is further arranged to:
- divide all blocks in the flash memory module into a plurality of groups, wherein the plurality of groups comprise the first group and the second group.

9. The flash memory controller of claim 8, wherein each of the plurality of groups has a same number of blocks.

10. The flash memory controller of claim 8, wherein the step of dividing all blocks in the flash memory module into the plurality of groups comprises:
- estimating a temperature change curve of the flash memory module during the test to determine a number of blocks comprised in each of the plurality of groups, so that a temperature change of each of the plurality of groups during the test is within a critical value.

11. The flash memory controller of claim 7, wherein the step of determining the number of first blocks of the first group according to the plurality of temperature information of the flash memory module further comprises:
- in response to there not being any untested block in the flash memory module, stopping performing data writing upon the subsequent blocks of the flash memory module, and regarding the blocks that are located after the first of the plurality of first blocks of the first group and have completed data writing as the plurality of first blocks of the first group.

* * * * *